United States Patent [19]
Batko et al.

[11] Patent Number: 5,772,326
[45] Date of Patent: Jun. 30, 1998

[54] TEMPERATURE AND PASSIVE INFRARED SENSOR MODULE

[75] Inventors: Thomas J. Batko, Wallingford; David P. Eckel, Wethersfield, both of Conn.

[73] Assignee: Hubbell Incorporated, Orange, Conn.

[21] Appl. No.: 705,778

[22] Filed: Aug. 30, 1996

[51] Int. Cl.$^6$ ............................ G01K 13/02; G01K 1/14; G08B 13/19

[52] U.S. Cl. .......................... 374/142; 374/138; 236/51; 236/DIG. 19; 250/342; 250/DIG. 1; 340/567

[58] Field of Search ................................. 374/142, 138, 374/135; 236/51, 47, DIG. 19; 250/342, 349, DIG. 1, 339.04, 339.14; 340/567

[56] References Cited

U.S. PATENT DOCUMENTS

| | | | |
|---|---|---|---|
| 4,301,682 | 11/1981 | Everest | 374/133 |
| 4,435,093 | 3/1984 | Krause et al. | 374/141 |
| 4,746,910 | 5/1988 | Pfister et al. | 340/567 |
| 4,924,096 | 5/1990 | Mroczkowski et al. | 250/338.1 |
| 4,932,789 | 6/1990 | Egawa et al. | 374/130 |
| 5,017,018 | 5/1991 | Iuchi et al. | 374/130 |
| 5,106,325 | 4/1992 | Robinson et al. . | |
| 5,115,967 | 5/1992 | Wedekind . | |
| 5,127,575 | 7/1992 | Beerbaum | 236/47 |
| 5,262,647 | 11/1993 | Kumada | 250/342 |
| 5,266,807 | 11/1993 | Neiger . | |
| 5,290,175 | 3/1994 | Robinson et al. . | |
| 5,327,047 | 7/1994 | Gershen . | |
| 5,336,979 | 8/1994 | Watson et al. . | |
| 5,395,042 | 3/1995 | Riley et al. . | |
| 5,402,298 | 3/1995 | Gershen et al. . | |
| 5,406,436 | 4/1995 | Doyle et al. . | |
| 5,475,364 | 12/1995 | Kenet | 340/567 |
| 5,477,412 | 12/1995 | Neiger et al. . | |
| 5,479,812 | 1/1996 | Juntunen et al. . | |
| 5,485,058 | 1/1996 | Watson et al. . | |
| 5,509,108 | 4/1996 | Yeh . | |
| 5,525,846 | 6/1996 | Newell et al. . | |
| 5,627,518 | 5/1997 | Wishart | 340/567 |
| 5,640,143 | 6/1997 | Myron et al. . | |
| 5,670,943 | 9/1997 | Dipoala et al. | 340/567 |

FOREIGN PATENT DOCUMENTS

| | | | |
|---|---|---|---|
| 2-61187 | 10/1988 | Japan | 250/DIG. 1 |
| 401277796 | 11/1989 | Japan | 250/DIG. 1 |
| 404128684 | 4/1992 | Japan | 250/DIG. 1 |
| 2170952 | 8/1986 | United Kingdom | 250/DIG. 1 |
| 8100764 | 3/1981 | WIPO | 250/349 |

Primary Examiner—Diego F.F. Gutierrez
Attorney, Agent, or Firm—Jerry M. Presson; William C. Roch

[57] ABSTRACT

A temperature and passive infrared sensor module comprising a sensor module housing having air flow vents therein in top and bottom or side surfaces to allow air to circulate through the sensor module housing. A temperature sensor is mounted in the sensor module housing in a position which is exposed to air circulating through the sensor module housing. A passive infrared sensor is also mounted in the sensor module housing in a manner in which it is not exposed to air circulating through the sensor module housing, such that it is not adversely affected thereby. In one embodiment, a foam block is positioned around to encase and isolate the passive infrared detector. In several embodiments, the passive infrared sensor and temperature sensor are mounted on opposite sides of the printed circuit board such that air circulates around the temperature sensor only on one side of the printed circuit board. In other embodiments, the passive infrared sensor and temperature are positioned on the same side of a printed circuit board, and a partition is positioned therebetween to prevent air circulating around the temperature sensor from reaching and circulating around the passive infrared sensor.

24 Claims, 6 Drawing Sheets

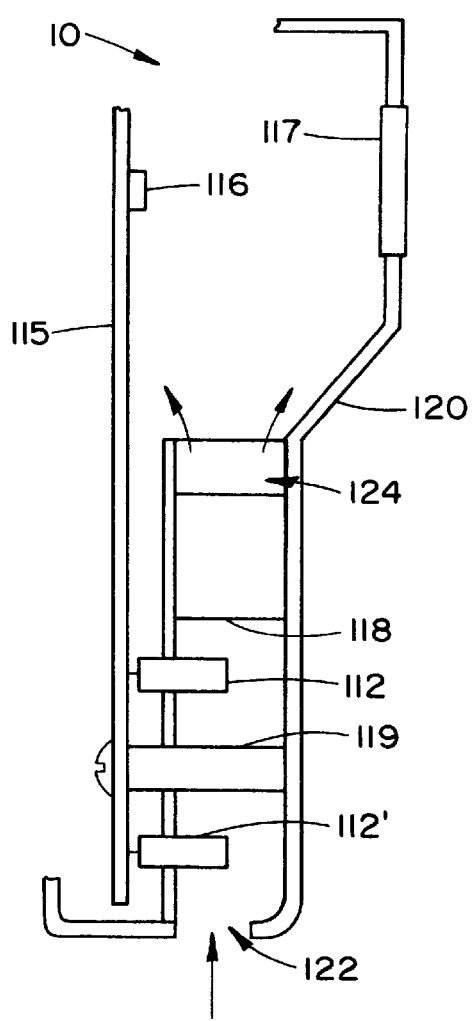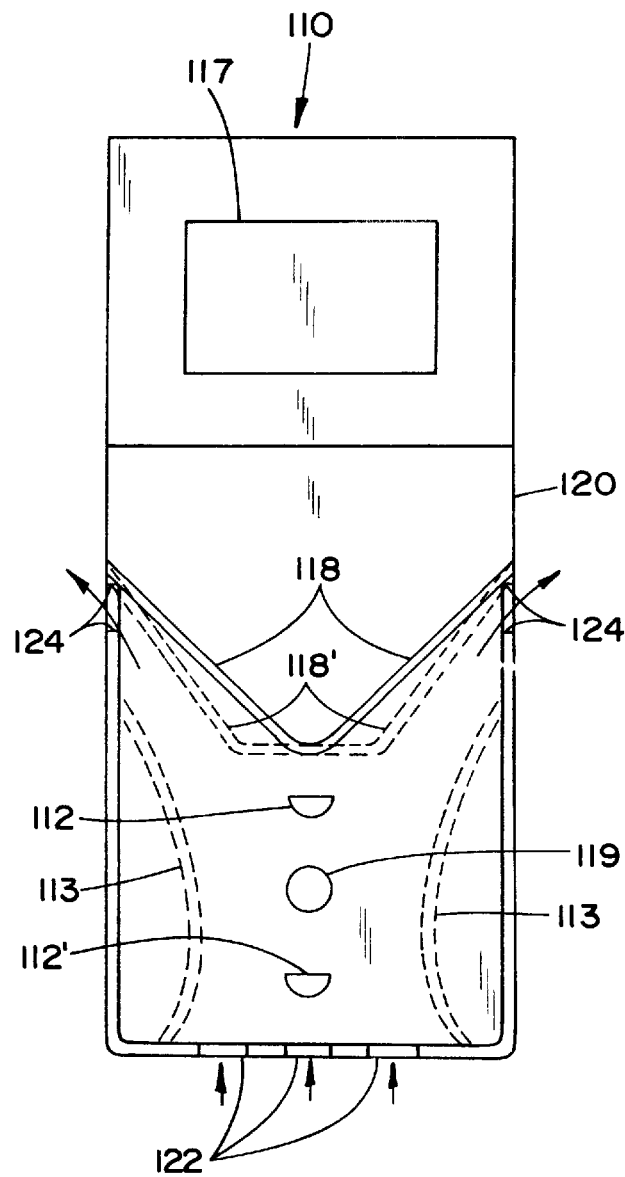
FIG. 11                    FIG. 10

TEMPERATURE AND PASSIVE INFRARED SENSOR MODULE

BACKGROUND OF THE INVENTION

Field of the Invention

The present invention relates generally to a sensor module, and more particularly pertains to a temperature and passive infrared sensor module as might be utilized in an occupied space networked environment such as an automated office building in which sensors are installed to sense and control various parameters therein. The sensors can include an occupancy sensor, such as a passive infrared sensor or an ultrasonic sensor, a temperature sensor, an ambient light sensor, a relative humidity sensor, a $CO_2$ system, a security sensor, and other parameter sensors.

It is desirable to provide a plurality of such parameter sensors in one sensor module which can interface with one or more microprocessor control systems to control operation of the lighting systems, climate control systems, fire alarm systems, etc. in the occupied space networked environment such as an office building. Such microprocessor control systems devices are available commercially which incorporate networking such as, an Echelon LONWORKS system or, CE Bus, BacNet, etc.

However, the mounting and exposure requirements of the diverse parameter sensors in a sensor module are often quite different, such that it is difficult to mount the diverse sensors in a common sensor module. For instance, a temperature sensor should be mounted to be open and exposed to a flow of air from the environment of a room being monitored, while a passive infrared occupancy sensor should be mounted so as not to be exposed to a flow of air from the environment of the room being monitored. The temperature sensor should also be insulated or shielded from direct exposure to and heat loading from sunlight.

SUMMARY OF THE INVENTION

Accordingly, it is a primary object of the present invention to provide a temperature and passive infrared sensor module in which a temperature sensor is mounted to be open and exposed to a flow of air from the environment of a room being monitored and is also insulated and shielded from direct exposure to and heat loading from sunlight, and a passive infrared sensor is mounted so as not to be exposed to a flow of air from the environment of the room being monitored. The sensor module can be incorporated in a surface wall mounted unit, or a wall switch mounted (recessed) unit, or a ceiling mounted unit.

A further object of the subject invention is the provision of a temperature sensing module (RTD, thermistor, digital/analog thermometer, etc.) which comprises a temperature sensing circuit, a temperature/air flow channel, an electrical connector to connect to an external motherboard PC board, and a mechanical fitting to snap/fit into an existing plastic sensor housing. The sensor device can provide a digital or analog signal to a microprocessor, and can be used in a networked environment such as in an Echelon LONWORKS system, CE Bus, BacNet, etc. The air flow channel blocks airflow to the sensitive passive infrared sensor area to eliminate interference thereto, and also insulates from direct front panel heat loading from sunlight.

In accordance with the teachings herein, the present invention provides a temperature and passive infrared sensor module comprising a sensor module housing having air flow vents therein to allow air to circulate through the sensor module housing. A temperature sensor is mounted in the sensor module housing in a position which is open to air circulating through the sensor module housing. A passive infrared sensor is also mounted in the sensor module housing, with a layer of insulating material surrounding the passive infrared sensor, such that the passive infrared sensor is not exposed to air circulating through the sensor module housing and is not adversely affected thereby.

In greater detail, the air flow vents are provided in top and bottom surfaces of the sensor module housing to provide a circulating air flow around the temperature sensor. Air flow vents can also be provided in opposite side surfaces of the sensor module housing to provide additional circulating air flow around the temperature sensor. In one embodiment, the layer of insulating material includes a foam block positioned around to encase the passive infrared detector. The passive infrared sensor includes electrical leads extending thereto, and the foam block is also preferably positioned around the electrical leads. A lens is positioned in front of the passive infrared detector to focus infrared radiation thereon, and also prevents air which is circulating through the module housing from circulating around the passive infrared sensor. A lens retainer element is provided for retaining the lens securely in place, and the foam block is positioned between the lens retainer element and a printed circuit board on which the passive infrared sensor is mounted.

In one embodiment, the passive infrared sensor and temperature sensor are mounted on opposite sides of the printed circuit board such that air circulates around the temperature sensor on one side of the printed circuit board, but does not circulate around the passive infrared sensor on the opposite side of the printed circuit board. In a second embodiment, the passive infrared sensor and temperature are positioned on the same side of a printed circuit board, and a partition is positioned between the passive infrared sensor and the temperature sensor to prevent air circulating around the temperature sensor from reaching and circulating around the passive infrared sensor.

In several embodiments, at least one air duct is provided extending between the air flow vents and the temperature sensor to channel the flow of air from the air flow vents to the temperature sensor. In one embodiment, a plurality of air flow ducts extend from the top to the bottom of the sensor module housing, and the temperature sensor is mounted centrally within the plurality of air ducts. In a second embodiment, the temperature sensor is mounted on a first side of the printed circuit board, on which most of the electrical components are also mounted, and the air duct is mounted in a position covering the temperature sensor, and extends from air flow vents in the top of the sensor module housing to air flow vents in the bottom of the sensor module housing. In a further embodiment, the air duct covers substantially the entire side of the printed circuit board on which the temperature sensor is mounted.

In one embodiment in which the passive infrared sensor and the temperature sensor are mounted on opposite sides of the printed circuit board, the printed circuit board is mounted on a front housing member of the sensor module housing which is pivoted about its lower end to adjust the angular field of view of the passive infrared sensor. The air flow duct is secured to a back housing member of the sensor module housing, and since the air flow duct is attached to the back housing and the angular position of the front housing and PC board is adjustable relative to the back housing, the temperature sensor is positioned nearer to the bottom end of the printed circuit board to minimize movements between the air flow duct and the temperature sensor during such angular adjustments. Moreover, a layer of foam insulating material is placed around the temperature sensor by an aperture in the air flow duct, in which the temperature sensor is positioned, to accommodate the angular adjustments.

In another embodiment, the temperature sensor is mounted in a small enclosure within the sensor module housing, and the small enclosure includes air flow vents in an inside bottom surface and also near the top outside thereof to allow air to circulate therein and around the temperature sensor.

In an alternative embodiment, the sensor module housing includes air flow vents in a bottom surface and air flow vents in opposite side surfaces of the sensor module housing, and the temperature sensor is positioned centrally in the sensor module housing between the air flow vents in the bottom surface and the air flow vents in the opposite side surfaces.

In a further embodiment, the temperature sensor is mounted on a separate temperature sensor printed circuit board which is positioned in the sensor module housing centrally between air flow vents in a bottom surface of the sensor module housing and air flow vents near the top of the sensor module housing.

BRIEF DESCRIPTION OF THE DRAWINGS

The foregoing objects and advantages of the present invention for a temperature and passive infrared sensor module may be more readily understood by one skilled in the art with reference being had to the following detailed description of several preferred embodiments thereof, taken in conjunction with the accompanying drawings wherein like elements are designated by identical reference numerals throughout the several views, and in which:

FIGS. 10 and 11 are respectively schematic front elevational and side elevational views of a further embodiment of a temperature and passive infrared sensor module, and illustrate the mounting therein of a passive infrared detector and a temperature sensor and the circulation of air through the housing around the temperature sensor;

DETAILED DESCRIPTION OF THE DRAWINGS

Figure 1:
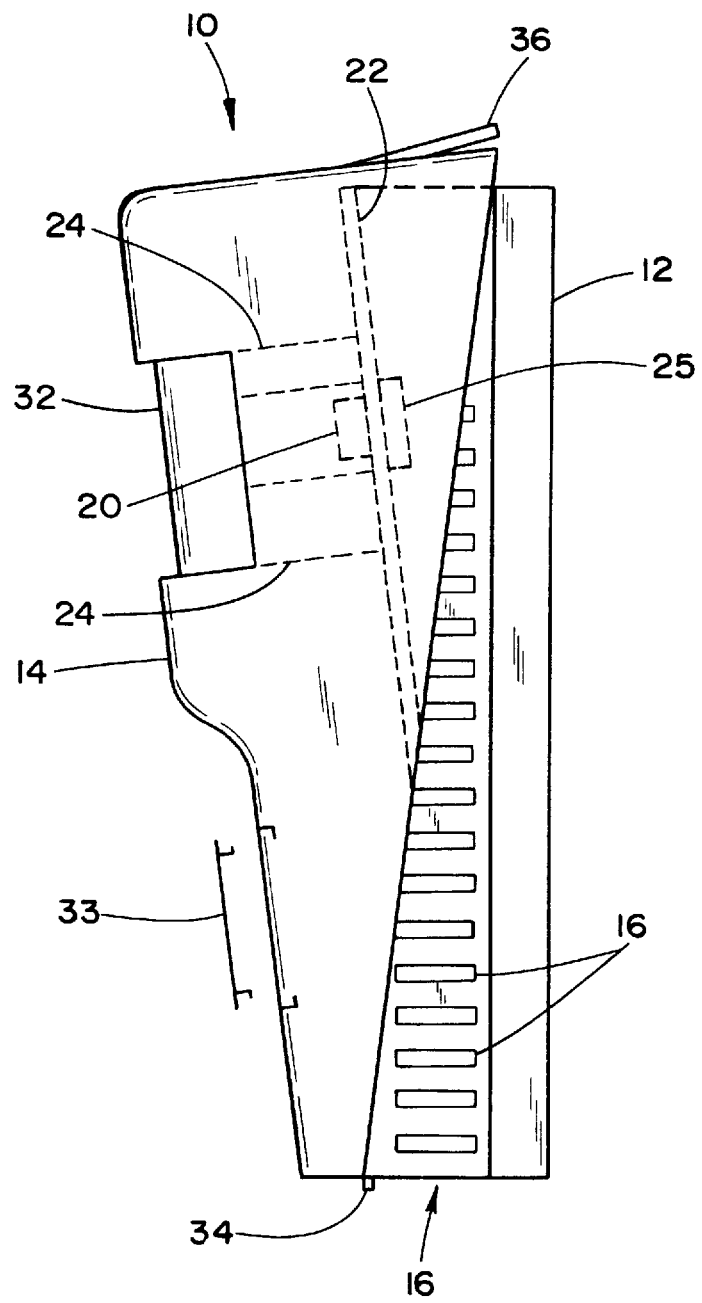
FIG. 1 is a side elevational view of a first embodiment of a temperature and passive infrared sensor module pursuant to the present invention.

Referring to the drawings in detail, FIG. 1 is a side elevational view of a first embodiment of a sensor module 10 pursuant to the teachings of the present invention. The sensor module 10 can incorporate therein a number of different parameter sensors such as a passive infrared sensor, an ultrasonic sensor, a temperature sensor, an ambient light sensor, a relative humidity sensor, a $CO_2$ system, a security sensor, and other parameter sensors.

The two sensors of particular interest to the development of the present invention are a passive infrared sensor and a temperature sensor. Passive infrared sensors are well known in the art and frequently comprise a segmented lens and an IR detector, and detect movement of IR sources within the field view of the detector. Temperature sensors are also well known in the art, and can include, for example, a temperature sensitive diode, thermistor, digital thermometer, etc. The mounting and exposure requirements of the passive infrared sensor and the temperature sensor are quite different, such that it is difficult to mount the two sensors in a common sensor module. The temperature sensor should be mounted to be exposed to a flow of air from the environment of a room being monitored, while the passive infrared sensor should not be exposed to a flow of air from the environment of the room being monitored. The temperature sensor should also be insulated or shielded from direct exposure to and heat loading from sunlight.

The sensor module 10 comprises a back housing member 12 which mounts to the wall of a room, and a front housing member 14 which mounts over the rear housing member 12. Air flow vents 16 are provided in top and bottom surfaces of the sensor module housing to provide a circulating air flow therein around the temperature sensor. Air flow vents 16 can also be provided in opposite side surfaces of the sensor module housing to provide additional circulating air flow around the temperature sensor.

Figure 3:
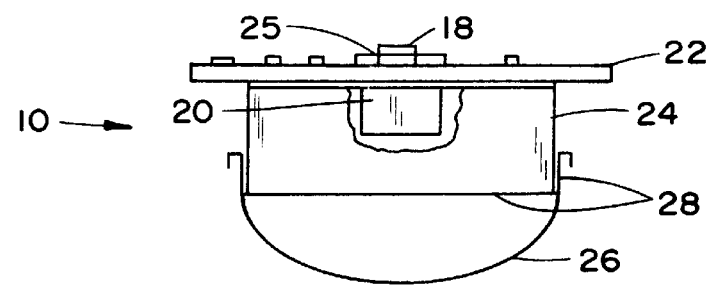
FIG. 3 is a top plan view of the temperature and passive infrared sensor module shown in FIG. 2, and illustrates the temperature sensor and passive infrared sensor mounted on opposite sides of the printed circuit board therein.
Figure 2:
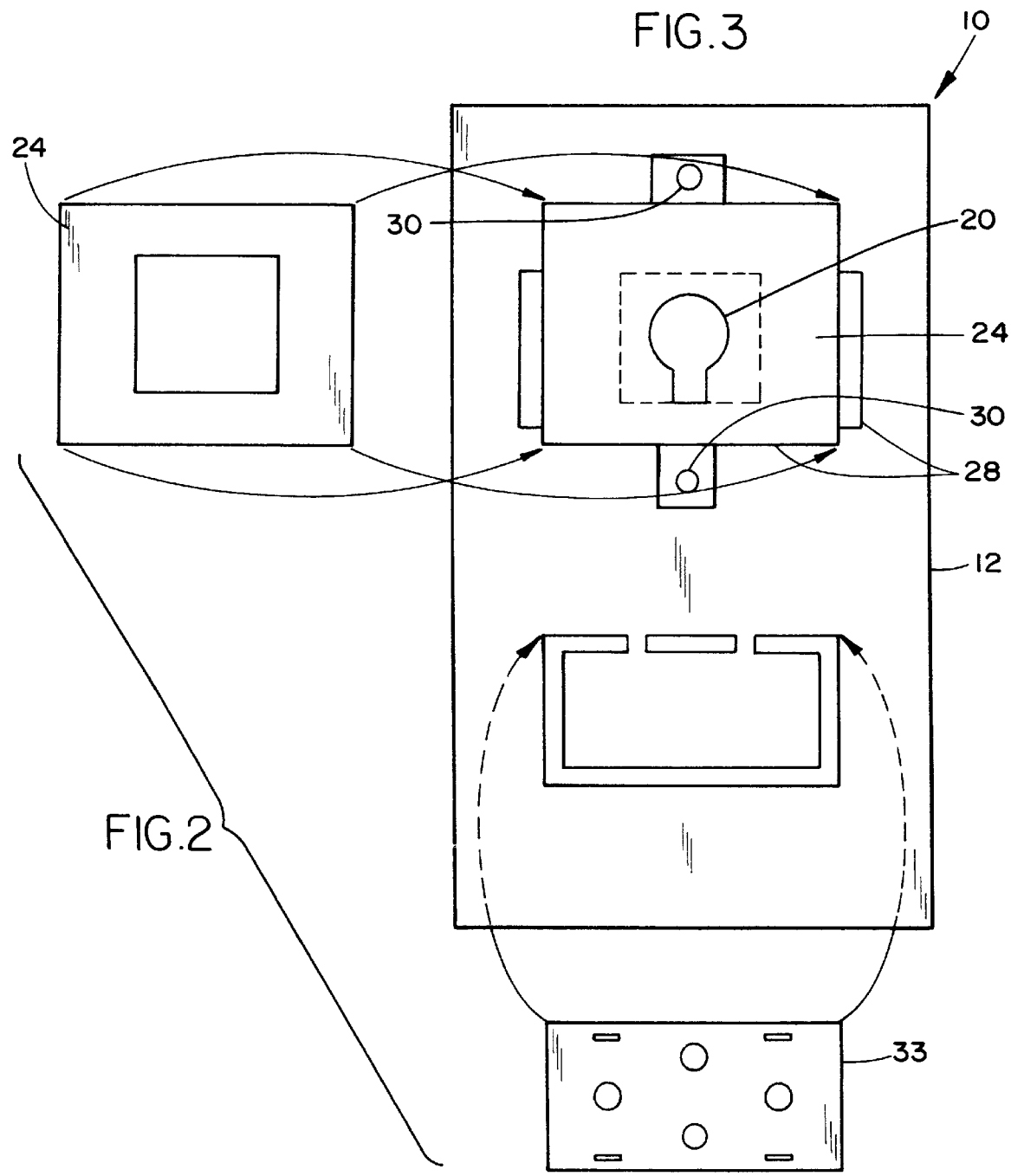
FIG. 2 is a front elevational view of the temperature and passive infrared sensor module shown in FIG. 1 with the front housing removed therefrom, and illustrates the mounting of the passive infrared detector therein surrounded by a foam block seal and enclosed by a lens retainer element.

FIG. 2 is a front elevational view of the sensor module 10 shown in FIG. 1 with the front housing 14 removed therefrom. FIG. 3 is a top plan view of the sensor module shown in FIG. 2, and illustrates a temperature sensor 18 and a passive infrared sensor 20 mounted on opposite sides of a printed circuit board 22 therein. The temperature sensor 18 is mounted in the sensor module housing in a position on the back of the PC board 22 which is open to air circulating through the sensor module housing. The passive infrared (PIR) sensor 20 is mounted in the sensor module housing, with a layer of insulating material surrounding and encasing it, such that it is not open to air circulating through the sensor module housing and is not adversely affected thereby.

The layer of insulating material can be a plastic molded encasement piece or a foam block 24 positioned on four sides surrounding the passive infrared detector 20. The passive infrared sensor 20 includes electrical leads extending thereto through the PC board 22, from the soldered side of the PC board. A separate 25 foam block can also be attached to the solder side of the PC board positioned on top of and around the electrical leads. A lens 26 is positioned in front of the passive infrared detector to focus infrared radiation thereon, and also prevents air which is circulating through the module housing from circulating around the passive infrared sensor. A lens retainer element 28 is provided for retaining the lens 26 securely in place, secured by screws 30, and the foam block 24 is positioned between the lens retainer element and the printed circuit board. The front housing member 14 also includes a window 32, through which the passive infrared detector views the environment surrounding the sensor module 10. A hinged coverbox or a snap-in door panel 33 can be used to provide mountings for switches, LEDs, etc., as is known in this art.

The printed circuit board 22 is fixedly mounted to and within the front housing member 14. The front housing member 14, and accordingly the printed circuit board also, is pivoted about a hinge 34 at the bottom end to adjust the angular field of view of the passive infrared sensor 20. At the top, the front housing member 14 includes a flexible tab 36 having a series of holes along its length, and a pin on the rear housing member 12 is snapped into one of the series of holes to adjust and maintain the angular view of the passive infrared detector 20.

Figure 4:
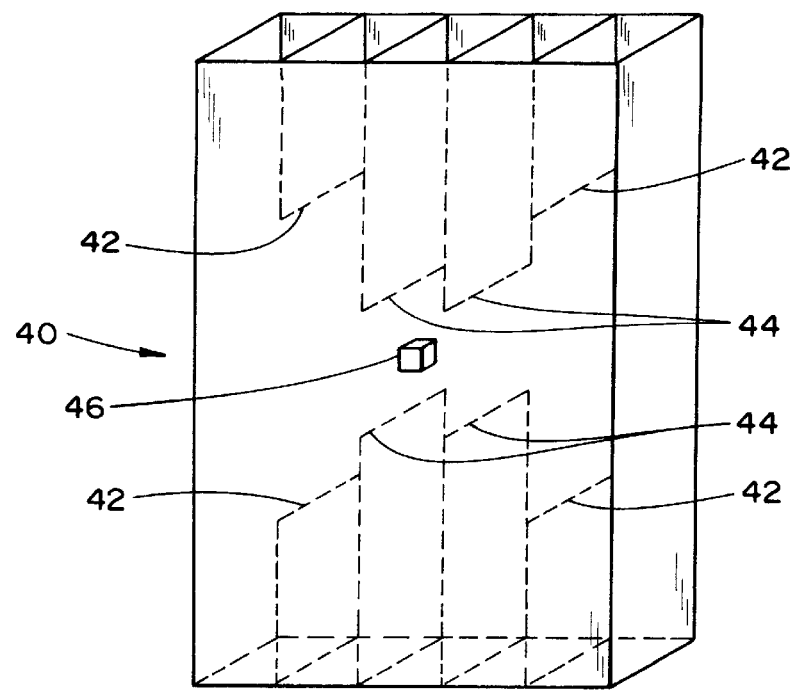
FIG. 4 is a front perspective view of a first embodiment of an air flow duct for enabling a flow of air to a temperature sensor mounted within a temperature and passive infrared sensor module.

FIG. 4 is a front perspective view of a first embodiment of an air flow duct 40 for controlling and directing a flow of air to a temperature sensor mounted within a sensor module. The air flow duct 40 would be positioned between air vents in the top and bottom surfaces of a sensor module, and includes variable length baffles 42 and 44 therein to control and channel the air flow to and around a temperature sensor 46 centrally mounted therein.

In alternative embodiments, the air flow duct could be completely open or channeled with different numbers and lengths of partitions, and can be an integral part of an occupancy sensor assembly housing or a separate insert therein. The air duct could be mounted on the PC board or on the sensor assembly housing. It can be used with a plastic foam seal to partition the section off, or with a suitable adhesive such as a plastic silicone cement such as RTV, or with mounting slots. The partitions can be used to channel air flow or to block parts or leads or components, such as the passive infrared detector, from the air flow. Some sections or channels could be filled with foam or other restrictive devices (e.g. a honeycomb) for temperature or electrical or mechanical isolation.

Figure 5:
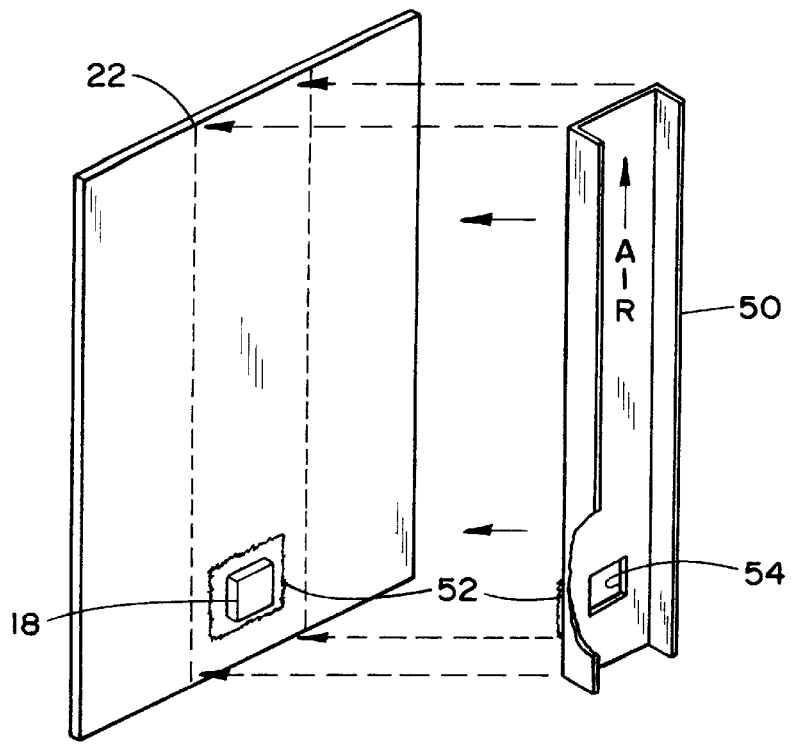
FIG. 5 is an exploded view of a second embodiment of an air flow duct for enabling a flow of air to a temperature sensor mounted on a printed circuit board within a temperature and passive infrared sensor module similar to that illustrated in FIGS. 1–3.

FIG. 5 is an exploded view of an embodiment of an air flow duct 50 for enabling a flow of air to a temperature sensor 18 mounted on a printed circuit board within a sensor module similar to that illustrated in FIGS. 1–3. The air flow duct 50 is designed to attach, as by glue, to the back housing 12 which closes the rear of the open duct illustrated in FIG. 5. Since the air flow duct 50 is attached to the back housing 12, and the angular position of the PC board 22 is adjustable relative to the back housing, via elements 34 and 36, the temperature sensor 18 is positioned nearer to the bottom end of the printed circuit board 22 to minimize movements between the air flow duct 50 and the temperature sensor 18 during such angular adjustments. Moreover, a layer of foam insulating material 52 is placed around the temperature sensor 18 by an aperture 54 in the air duct in which the temperature sensor 18 is positioned, to accommodate the angular adjustments. The air flow duct 50 is designed to minimize and inhibit the flow of air in and through the product housing while directing it particularly around the temperature sensor 18, and could take many different shapes and designs.

Figure 6:
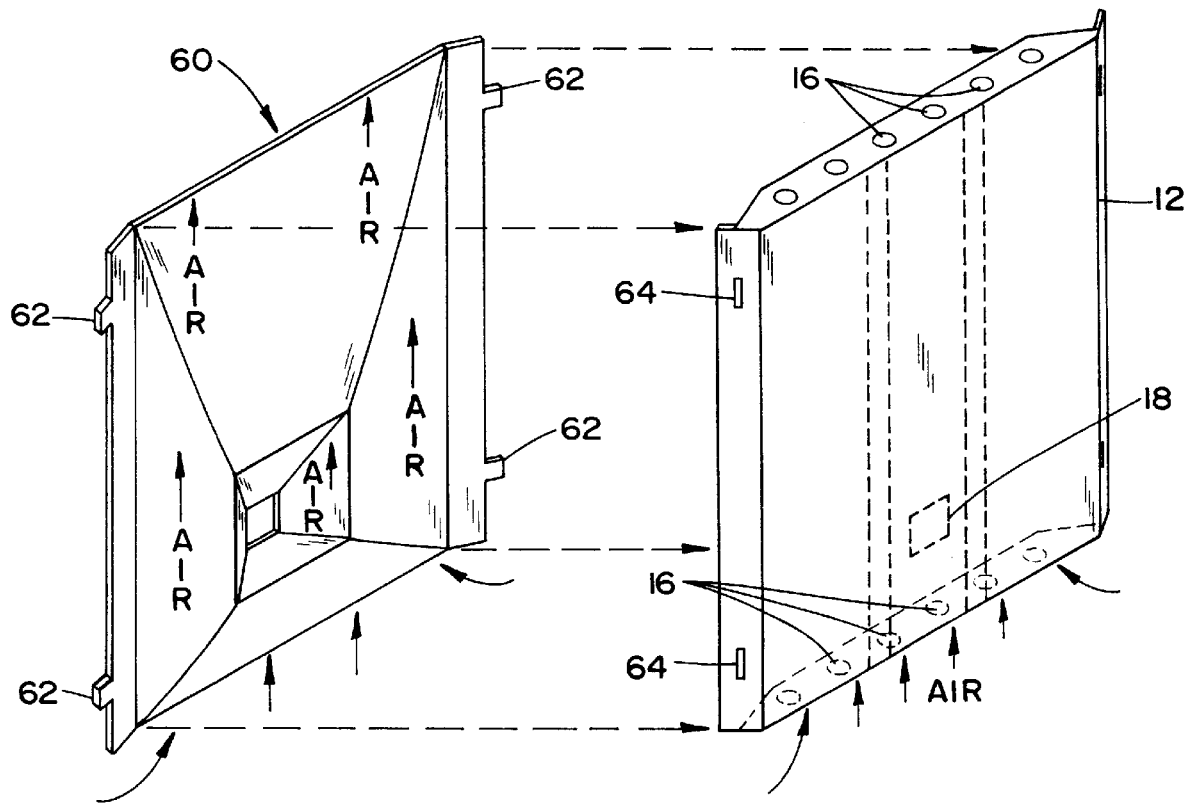
FIG. 6 is an exploded view of a third embodiment of an air flow duct for enabling the circulation of air to a temperature sensor mounted on a printed circuit board within a temperature and passive infrared sensor module similar to that illustrated in FIGS. 1–3.

FIG. 6 is an exploded view of another embodiment of an air flow duct 60 for enabling the circulation of air to a temperature sensor mounted on a printed circuit board within a sensor module similar to that illustrated in FIGS. 1–3. The design of air flow duct 60 is similar in principle to the design of air flow duct 50, but the air flow duct 60 is designed to provide a greater flow of air around the temperature sensor 18 and covers substantially the entire side of the printed circuit board on which the temperature sensor is mounted. The air flow duct 60 can be vacuum molded, and can include clips 62 to clip into apertures 64 in the back housing 12, or can be glued thereto. As illustrated in FIG. 6, air flow is provided between air vents 16 in the top and bottom of the back housing 12. The design provides a flow of circulating air only through the duct 60 around the temperature sensor 18 and other electrical components mounted on that side of the PC board, but not through the rest of the housing and particularly not around the passive infrared detector 20. In this embodiment the passive infrared sensor and temperature sensor are mounted on opposite sides of the printed circuit board, such that air circulates around the temperature sensor on one side of the printed circuit board, but does not circulate around the passive infrared sensor on the opposite side of the printed circuit board.

The embodiments of FIGS. 1–3, 5 and 6 have the temperature sensor and the PIR sensor mounted on opposite sides of the PC board.

Figure 7:
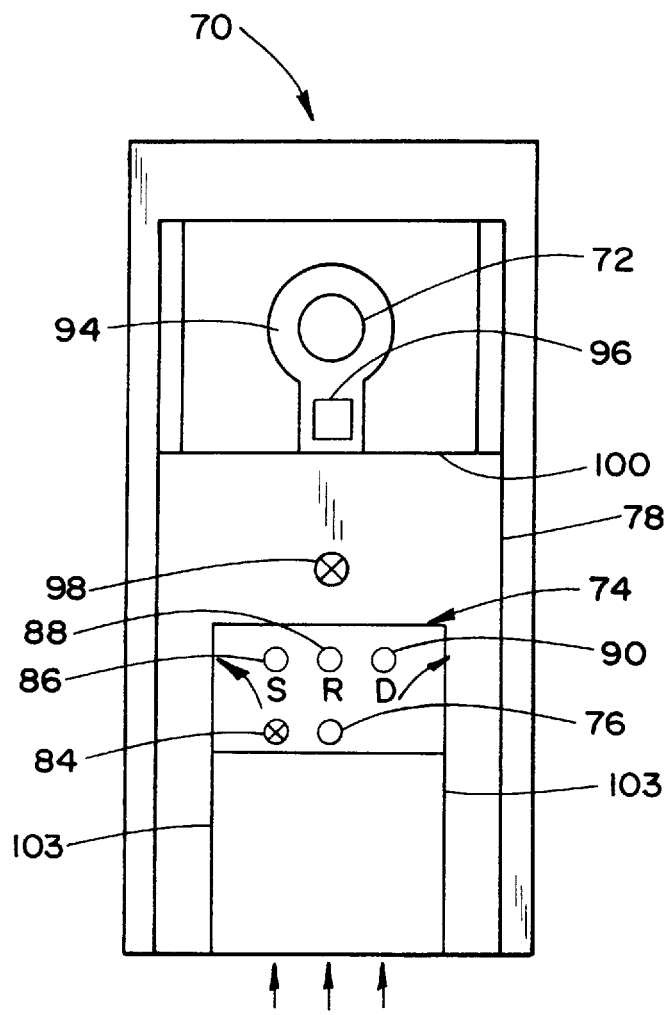
FIGS. 7 and 8 are respectively schematic front elevational and bottom views of a further embodiment of a temperature and passive infrared sensor module, and illustrate the mounting therein of a passive infrared detector and a temperature sensing module.
Figure 8:
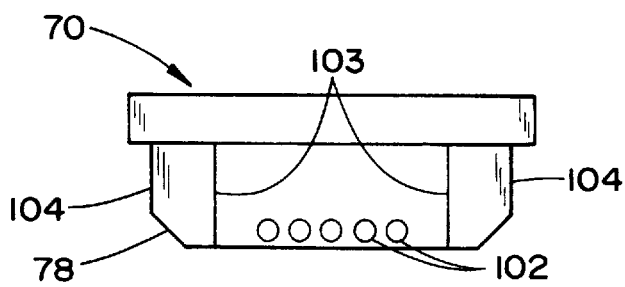
Figure 9:
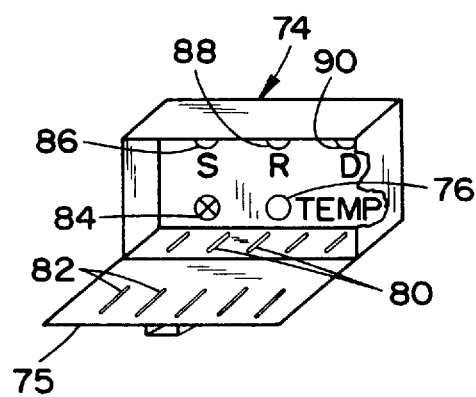
FIG. 9 is a front perspective view of only the temperature sensing module shown in FIG. 7.

FIGS. 7 and 8 are respectively schematic front elevational and bottom views of a further embodiment of a sensor module 70, and illustrate the mounting therein of a passive infrared detector 72 and a temperature sensing module 74. FIG. 9 is a front perspective view of only the temperature sensing module 74 shown in FIG. 7. FIG. 9 illustrates the temperature sensor module 74 with a front door 75 open, while FIG. 7 does not show the front door 75. The front door 75 is normally shut and is positioned at the front of sensor module 70, such that the air vents 82 therein open directly to the ambient atmosphere in front of the sensor module 74. In this embodiment, the temperature sensor 76 is mounted in the small enclosed module 74 which is mounted in the front of the sensor module housing 78, and the small enclosed module 74 includes air flow vents in an inside bottom surface at 80 and also near the top front on the outside thereof at 82 to allow air to circulate therein and around the temperature sensor 76. The module 74 is of a design generally known in the prior art (without the temperature sensor 76 mounted therein), and is provided for service functions. The module 74 provides the following service functions, a service LED 84, a service push-button switch 86, a reset push-button switch 88, and a daylight push-button switch or potentiometer 90. FIGS. 7 and 9 illustrate a modified arrangement of these known service functions wherein the temperature sensor 76 and air flow vents 80 and 82 have been added to the module. The service module 74 can clip onto the front housing member 78.

The sensor module 70 illustrated in FIG. 7 also includes a lens 94 positioned in front of the passive infrared sensor 72, an ambient light detector 96 positioned next to the passive infrared 72, and a motion detector LED 98. In this embodiment, the passive infrared sensor 72 and temperature sensor 76 are positioned on the same front side of the printed circuit board, and a partition 100 is provided between the passive infrared sensor 72 and the temperature sensor module 74 to prevent air circulating around the temperature sensor from reaching and circulating around the passive infrared sensor. The sensor module housing 78 includes air flow vents in a bottom surface at 102 and air flow duct surfaces 103 on opposite sides extending upwardly therefrom to the module 74, such that air flows through the bottom vents 102, is channeled upwardly by the ducts 103 to flow through the bottom vents 80 in the module 74, flows around the temperature sensor 76, and then flows up and out though the top front ducts 82, such that the air is vented through the ducts 82 directly to the atmosphere outside and in front of the sensor module housing 78. The temperature sensor module 74 is positioned in the sensor module housing 78 centrally between the air flow vents 102 in the bottom surface and the top front ducts 82.

Instead of module circuit block functions, and based upon cost and performance considerations, in alternative embodiments a multi-channel ADC convertor can be used with individual discrete sensor circuits such as a thermistor or photocell. However, the module block functions allow future possible population or depopulation device/function configurations to be made easily.

FIGS. 10 and 11 are respectively schematic front elevational and side elevational views of a further embodiment of a sensor module 110, and illustrate the mounting therein of a passive infrared detector 116 on a PC board 115 behind a lens 117 and the circulation of air through the housing around a temperature sensor 112. The PC board 115 is mounted to the front module housing by screws and mounting bosses, one of which is illustrated at 119. In this embodiment, the temperature sensor 112 can be mounted below a service module which is similar to service module 74 but not provided with a temperature sensor or vent holes. The passive infrared sensor 116 and temperature sensor 112 are positioned on the same front side of the printed circuit board 115, and a V shaped partition 118 between the passive infrared sensor 116 and the temperature sensor 112 prevents air circulating around the temperature sensor from reaching and circulating around the passive infrared sensor 116. The sensor module housing 120 includes air flow vents in a bottom surface at 122 and air flow vents in opposite side surfaces at 124 of the sensor module housing 120, and the temperature sensor 112 is positioned in the sensor module housing 120 centrally between the air flow vents 122 in the bottom surface and the air flow vents 124 in the opposite side surfaces. FIGS. 10 and 11 illustrate an alternative mounting position for the temperature sensor at 112'. Moreover, an alternative partition 118' is shown in phantom for embodiments wherein the temperature sensor is mounted below a service module. Moreover, possible side duct walls are illustrated in phantom at 113 for a more directed flow of air around the temperature sensor.

Figure 12:
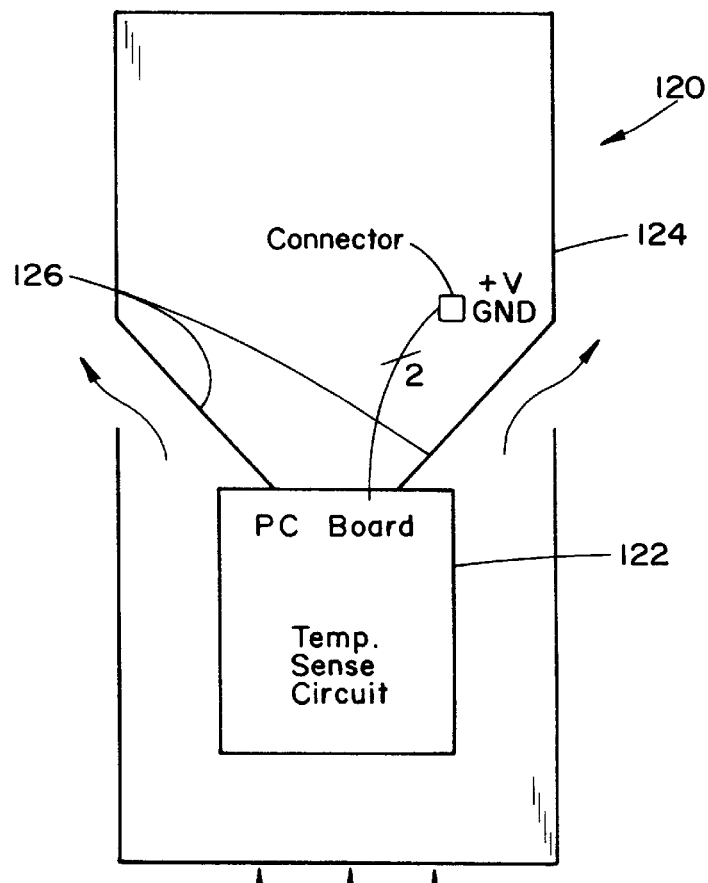
FIG. 12 is a schematic front elevational view of a further embodiment of a temperature and passive infrared sensor module in which a separate temperature sensing circuit board is installed within an existing product housing.

FIG. 12 is a schematic front elevational view of a further embodiment of a sensor module 120 which has a separate temperature sensing printed circuit board 122 installed within an existing product housing 124. The temperature sensor is mounted on the separate temperature sensor printed circuit board 122 which is positioned in the sensor module housing centrally between air flow vents in a bottom surface of the sensor module housing and air flow vents on the sides of the sensor module housing. A V-shaped partition 126 separates the temperature sensor PC board 122 from the PIR sensor which is mounted in the top portion of the housing 124. A connector (2 pin) and digital or analog output could be provided as flying leads to a connector or header or terminal block or RJ11 telephone connector.

The embodiments of FIGS. 7–11 have the temperature sensor and the PIR sensor mounted on the same side of the PC board.

While several embodiments and variations of the present invention for a temperature and passive infrared sensor module are described in detail herein, it should be apparent that the disclosure and teachings of the present invention will suggest many alternative designs to those skilled in the art.

What is claimed is:

1. A temperature and passive infrared sensor module comprising:
   a. a sensor module housing having air flow vents therein to allow air to circulate through the sensor module housing;
   b. a temperature sensor mounted in the sensor module housing in a position which is exposed to air circulating through the sensor module housing;
   c. a passive infrared sensor mounted in the sensor module housing, with a layer of insulating material surrounding the passive infrared sensor such that the passive infrared sensor is not exposed to air circulating through the sensor module housing and is not adversely affected thereby.

2. A temperature and passive infrared sensor module as claimed in claim 1, wherein the air flow vents are provided in a top surface and a bottom surface of the sensor module housing to provide a circulating air flow around the temperature sensor.

3. A temperature and passive infrared sensor module as claimed in claim 2, wherein the air flow vents are provided in opposite side surfaces of the sensor module housing to provide a circulating air flow around the temperature sensor.

4. A temperature and passive infrared sensor module as claimed in claim 1, wherein the layer of insulating material includes a foam block positioned on four sides surrounding the passive infrared detector.

5. A temperature and passive infrared sensor module as claimed in claim 4, wherein the passive infrared sensor includes electrical leads extending thereto and the foam block is also positioned around the electrical leads.

6. A temperature and passive infrared sensor module as claimed in claim 4, including a lens positioned on a fifth side of the passive infrared detector to focus infrared radiation thereon and which also prevents air which is circulating through the module housing from circulating around the passive infrared sensor.

7. A temperature and passive infrared sensor module as claimed in claim 6, including a lens retainer element for retaining the lens securely in place, wherein the foam block is positioned between the lens retainer element and a printed circuit board on which the passive infrared sensor is mounted.

8. A temperature and passive infrared sensor module as claimed in claim 6, including a photocell mounted adjacent to the passive infrared sensor for detecting ambient light.

9. A temperature and passive infrared sensor module as claimed in claim 1, wherein the temperature sensor and the passive infrared sensor are mounted on a printed circuit board.

10. A temperature and passive infrared sensor module as claimed in claim 9, wherein a plurality of electrical components of the sensor module are mounted on a first side of the printed circuit, the temperature sensor is mounted on the first side of the printed circuit board, and the passive infrared sensor is mounted on a second opposite side of the printed circuit board.

11. A temperature and passive infrared sensor module as claimed in claim 9, wherein the passive infrared sensor includes electrical leads extending through the printed circuit board, and a layer of insulating material is positioned around the electrical leads extending through the printed circuit board.

12. A temperature and passive infrared sensor module as claimed in claim 1, wherein the passive infrared sensor and temperature sensor are mounted on opposite sides of a printed circuit board and air circulates around the temperature sensor on one side of the printed circuit board but does not circulate around the passive infrared sensor on the opposite side of the printed circuit board.

13. A temperature and passive infrared sensor module as claimed in claim 1, wherein the passive infrared sensor and temperature sensor are positioned on the same side of a printed circuit board, and a partition between the passive infrared sensor and the temperature sensor prevents air circulating around the temperature sensor from circulating around the passive infrared sensor.

14. A temperature and passive infrared sensor module as claimed in claim 1, wherein the passive infrared sensor includes electrical leads extending thereto and the insulating material is also positioned around the electrical leads.

15. A temperature and passive infrared sensor module comprising:
   a. a sensor module housing having air flow vents therein to allow air to circulate through the sensor module housing;
   b. a temperature sensor mounted in the sensor module housing in a position which is exposed to air circulating through the sensor module housing;
   c. at least one air duct extending between the air flow vents and the temperature sensor to channel the flow of air from the air flow vents to the temperature sensor.
   d. a passive infrared sensor mounted in the sensor module housing in a position in which the passive infrared sensor is not exposed to air circulating through the sensor module housing and is not adversely affected thereby.

16. A temperature and passive infrared sensor module as claimed in claim 15, including a plurality of air ducts extending from the top of the sensor module housing to the bottom of the sensor module housing, and wherein the temperature sensor is mounted centrally within the plurality of air ducts.

17. A temperature and passive infrared sensor module as claimed in claim 15, wherein the air flow vents in the sensor module housing include air flow vents in a top and in a bottom of the sensor module housing, and wherein the temperature sensor is mounted on a first side of a printed circuit board on which a plurality of electrical components are mounted, and the air duct is mounted in a position covering the temperature sensor, and extends from the air flow vents in the top of the sensor module housing to the air flow vents in the bottom of the sensor module housing.

18. A temperature and passive infrared sensor module as claimed in claim 17, wherein a layer of foam insulating material is placed around the temperature sensor in an aperture in the air duct in which the temperature sensor is positioned.

19. A temperature and passive infrared sensor module as claimed in claim 17, wherein the air duct covers substantially the entire side of the printed circuit board on which the temperature sensor is mounted.

20. A temperature and passive infrared sensor module as claimed in claim 17, wherein the passive infrared sensor is mounted on an opposite side of the printed circuit board from the temperature sensor, and the printed circuit board is pivoted about a first end to adjust the angular field of view of the passive infrared sensor, and the temperature sensor is positioned nearer to the first end of the printed circuit board than a second opposite end of the printed circuit board.

21. A temperature and passive infrared sensor module as claimed in claim 20, wherein the air duct is secured to a back housing member of the sensor module housing.

22. A temperature and passive infrared sensor module as claimed in claim 15, wherein the temperature sensor is mounted in a small enclosure within the sensor module housing and the small enclosure includes air flow vents in a bottom surface of the small enclosure and also near the top of the small enclosure to allow air to circulate therein and around the temperature sensor.

23. A temperature and passive infrared sensor module as claimed in claim 15, wherein the air flow vents in the sensor module housing include air flow vents in a bottom surface and air flow vents in opposite side surfaces of the sensor module housing, and the temperature sensor is positioned in the sensor module housing centrally between the air flow vents in the bottom surface and the air flow vents in the opposite side surfaces.

24. A temperature and passive infrared sensor module as claimed in claim 15, wherein the temperature sensor is mounted on a separate temperature sensor printed circuit board which is positioned in the sensor module housing centrally between air flow vents in a bottom surface of the sensor module housing and air flow vents near the top of the sensor module housing.

\* \* \* \* \*